(12) United States Patent
Sakuramoto et al.

(10) Patent No.: US 7,510,338 B2
(45) Date of Patent: Mar. 31, 2009

(54) OPTICAL TRANSMITTING/RECEIVING APPARATUS

(75) Inventors: Shin-ichi Sakuramoto, Kawasaki (JP); Masakazu Horishita, Kawasaki (JP); Kazuya Sasaki, Kawasaki (JP); Masaki Kunii, Kawasaki (JP); Tetsuya Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/892,652

(22) Filed: Aug. 24, 2007

(65) Prior Publication Data

US 2008/0008428 A1 Jan. 10, 2008

Related U.S. Application Data

(63) Continuation of application No. PCT/JP2006/303465, filed on Feb. 24, 2006.

(30) Foreign Application Priority Data

Feb. 25, 2005 (JP) .............................. 2005-051674

(51) Int. Cl.
*G02B 6/36* (2006.01)
(52) U.S. Cl. ............................ 385/92; 385/94; 398/138; 398/139; 398/142; 398/164
(58) Field of Classification Search .................. 385/14, 385/88, 89, 91, 92; 398/138, 139, 141, 142, 398/164
See application file for complete search history.

(56) References Cited

U.S. PATENT DOCUMENTS

| | | | | |
|---|---|---|---|---|
| 4,396,936 A | * | 8/1983 | McIver et al. ................ 174/252 |
| 6,318,908 B1 | * | 11/2001 | Nakanishi et al. ............. 385/89 |
| 6,334,716 B1 | | 1/2002 | Ojima et al. |
| 6,585,426 B2 | * | 7/2003 | Shuto et al. .................... 385/90 |
| 6,599,032 B1 | * | 7/2003 | Kurashima et al. ............ 385/89 |
| 2002/0154871 A1 | | 10/2002 | Nakura et al. |
| 2003/0002820 A1 | * | 1/2003 | Nakanishi et al. ............. 385/88 |
| 2003/0138223 A1 | | 7/2003 | Sasaki et al. |
| 2004/0076385 A1 | | 4/2004 | Asada et al. |
| 2005/0248822 A1 | | 11/2005 | Tohgoh et al. |

FOREIGN PATENT DOCUMENTS

EP 1 122 993 8/2001

(Continued)

OTHER PUBLICATIONS

International Search Report of International Published Application No. PCT/JP2006/303465 (mailed Mar. 28, 2006).

(Continued)

*Primary Examiner*—Sung H Pak
*Assistant Examiner*—Daniel Petkovsek
(74) *Attorney, Agent, or Firm*—Fujitsu Patent Center

(57) ABSTRACT

An optical transmitting/receiving apparatus capable of suppressing electrical crosstalk and magnetic crosstalk, includes: a laser diode/photo diode (LD/PD) integrated module that terminates a single-core bidirectional optical fiber; a circuit board electrically connected to a lead pin led out of the LD/PD integrated module; and a plastic case that accommodates the circuit board. At least a part of the plastic case abuts against the LD/PD integrated module, and impedance of the plastic case is controlled by mixing a conductive filler into the plastic case.

12 Claims, 12 Drawing Sheets

FOREIGN PATENT DOCUMENTS

| | | |
|---|---|---|
| EP | 1122993 A2 | 8/2001 |
| EP | 1122993 A3 | 8/2001 |
| JP | 06-138347 | 5/1994 |
| JP | 06-138347 A | 5/1994 |
| JP | 2000-009970 | 1/2000 |
| JP | 2000-9970 A | 1/2000 |
| JP | 2000-180671 | 6/2000 |
| JP | 2000-180671 A | 6/2000 |
| JP | 2000-310725 | 11/2000 |
| JP | 2000-310725 A | 11/2000 |
| JP | 2001-268020 | 9/2001 |
| JP | 2001-268020 A | 9/2001 |
| JP | 2002-318328 | 10/2002 |
| JP | 2002-318328 A | 10/2002 |
| JP | 2002-343984 | 11/2002 |
| JP | 2002-343984 A | 11/2002 |
| JP | 2003-207694 | 7/2003 |
| JP | 2003-207694 A | 7/2003 |
| JP | 2004-085756 | 3/2004 |
| JP | 2004-85756 A | 3/2004 |
| JP | 2004-157376 | 6/2004 |
| JP | 2004-157376 A | 6/2004 |

OTHER PUBLICATIONS

International Preliminary Report on Patentability dated Aug. 28, 2007 in corresponding PCT Application No. PCT/JP2006/303465 (5 pages).

* cited by examiner

1 OPTICAL TRANSMITTING/RECEIVING APPARATUS

FIG. 7

| EXPERIMENTAL EXAMPLE NUMBER | UNTRANSMITTED | TRANSMITTED | DETERIORATION AMOUNT (Δ) | PLASTIC CASE (NO CONDUCTIVE FILLER MIXED) | PLASTIC CASE (MIXED WITH CONDUCTIVE FILLER) | PRESENCE/ ABSENCE OF METAL SPRING MEMBER (PRESENCE =○) | PRESENCE/ ABSENCE OF SLEEVE (PRESENCE =○) |
|---|---|---|---|---|---|---|---|
| 1 | -28.9 | -27.1 | 1.8 | ○ | × | × | × |
| 2 | -29.0 | -27.3 | 1.7 | ○ | × | × | ○ |
| 3 | -29.0 | -28.6 | 0.4 | ○ | × | ○ | ○ |
| 4 | -29.0 | -28.9 | 0.1 | × | ○ | × | ○ |
| 5 | -29.0 | -29.0 | 0.0 | × | ○ | ○ | ○ |
| 6 | -29.0 | -28.7 | 0.3 | × | ○ | ○ | × |

FIG. 10

| CASE CONDUCTIVITY FILLER CONTENT RATE | IMPEDANCE | CROSSTALK IMPROVEMENT EFFECT | SYNTHETIC RESIN FLOWABILITY | PROCESSABILITY |
|---|---|---|---|---|
| 0% (CONVENTIONAL PRODUCT) | APPROXIMATELY $10^{+12}$ | NONE | | |
| ~20% | — | — | <6g/min | • MATERIAL IS SOFT AND FLOWS OUT OF MOLD<br>• CASE STRENGTH IS INSUFFICIENT |
| 20~30% | SEVERAL Ω TO SEVERAL HUNDREDS OF Ω | MINIMUM (OPTIMAL) | 1.3~6g/min | OPTIMAL |
| 30%~ | — | — | | |
| 100% | $10^{-2}$~$10^{-4}$ | EFFECT SIMILAR TO THAT OF METAL IS EXPECTED, BUT WHEN IDEAL GND IS NOT OBTAINED, INDUCTANCE COMPONENT GENERATES AND IMPROVEMENT EFFECT DETERIORATES | <1.3g/min | • MATERIAL IS HARD AND DIFFICULT TO BE FILLED TO MOLD |

OPTICAL TRANSMITTING/RECEIVING APPARATUS

CROSS-REFERENCE TO RELATED APPLICATION

This is a continuation of application PCT/JP2006/303465, filed on Feb. 24, 2006, now pending, the contents of which are herein wholly incorporated by reference.

BACKGROUND OF THE INVENTION

The present invention relates to an optical transmitting/receiving apparatus including a laser diode/photo diode (LD/PD) integrated module housed therein. Specifically, the present invention relates to an optical transmitting/receiving apparatus capable of suppressing electrical crosstalk and magnetic crosstalk.

Owing to a rapid widespread of a fiber to the home (FTTH) technology, it is becoming possible to easily stay connected to the Internet all the time at general homes. With the widespread of the fiber, an optical subscriber terminal apparatus (optical transmitting/receiving apparatus) is becoming downsized and low-priced (low-costed).

Up to now, an apparatus including a laser diode LD that transmits light (optical signal) and a photo diode PD that receives light as separate modules is in the mainstream, so the optical transmitting/receiving apparatus itself is large in size.

In view of the above, a small-sized LD/PD integrated module that terminates a single-core bidirectional optical fiber (optical fiber cable) is proposed (Patent Document 1). With regard to such a single-core bidirectional LD/PD module, the LD/PD integrated module is accommodated in a metal housing obtained by processing a metal plate into a box shape.

In the meantime, such an LD/PD integrated module has a structure in which a CAN package of an LD module and a CAN package of a PD module are electrically connected to the metal housing owing to an adhesive technique such as laser welding and have a common ground.

However, in a case where the LD module is driven at high frequency (LD modulation), owing to parasitic effects of stray capacitance (Cf) of lead pins and inner structural components of optical devices of the LD and the PD, stray inductance (Lf) of the metal housing portion, and the like, the ground (GND) of the LD/PD integrated module does not become ideal.

As a result, an electrical crosstalk path is formed between a transmission side (light emitting side) and a reception side (light receiving side) of the integrated module, and a magnetic noise (magnetic crosstalk) generates, with the result that reception sensibility deteriorates. FIG. 11 exemplifies a mechanism how such electrical crosstalk generates.

As a countermeasure against the above, it is considered to stabilize a ground potential by accommodating a circuit board mounted with the LD/PD integrated module in a metal case, fixing the metal housing of the LD/PD integrated module to the metal case, and allowing the metal housing electrically contact the metal case.

However, the following problems are pointed out. That is, the metal case makes the entire optical transmitting/receiving apparatus larger in size and is complicated in processing steps and heavyweight, and material cost of the metal plate increases.

Accordingly, there is proposed an optical transmitting/receiving apparatus in which an LD/PD module is accommodated in a plastic case which can be downsized, and is processed easily, lightweight, and low in cost.

However, in the case where an LD/PD module is accommodated in a plastic case, problems concerning electrical crosstalk and magnetic crosstalk come up again. In other words, the above-mentioned problems come up again as follows. That is, because there is employed a structure in which the LD/PD integrated module including an LD module accommodated in a metal housing and an PD module accommodated in a metal housing is fixed to the plastic case, ground of the LD/PD integrated module does not become ideal, an electrical crosstalk path is formed between the transmitting and receiving sides, and a magnetic noise (magnetic crosstalk) generates, with the result that reception sensibility deteriorates.

The following are related arts to the present invention.

[Patent document 1] Japanese Patent Laid-Open Publication No. 2000-180671

[Patent document 2] Japanese Patent Laid-Open Publication No. 06-138347

[Patent document 3] Japanese Patent Laid-Open Publication No. 2001-268020

SUMMARY OF THE INVENTION

The present invention has been made in view of the above-mentioned problems, and it is a technical object of the present invention to provide an optical transmitting/receiving apparatus still having a structure in which an LD/PD integrated module is accommodated in a plastic case and being capable of suppressing electrical crosstalk and magnetic crosstalk.

In order to attain the above-mentioned object, (1) an optical transmitting/receiving apparatus of the present invention includes: an LD/PD integrated module that terminates a single-core bidirectional optical fiber; a circuit board electrically connected to a lead pin led out of the LD/PD integrated module; and a plastic case whose impedance is controlled by mixing a conductive filler into the plastic case, that accommodates the circuit board therein. At least a part of the plastic case is allowed to abut on the LD/PD integrated module.

As described above, the plastic case obtained by mixing the conductive filler to a plastic case to control the impedance is allowed to abut on the LD/PD integrated module, so a resistant component is connected to an inductance component forming an electrical crosstalk path in parallel. Accordingly, dumping effect is imparted to resonance frequency of the inductance component, so the electrical crosstalk and the magnetic crosstalk can be suppressed.

(2) In the above-mentioned optical transmitting/receiving apparatus, the LD/PD integrated module may have a structure including a metal housing. The metal housing is allowed to abut on the plastic case mixed with the conductive filler to maintain a contact state, whereby the dumping effect can be further imparted.

(3) Further, a conductive spring member may be provided such that a leg portion thereof is engaged with a bottom portion of the plastic case, and a flat plate portion continuously provided to the leg portion biases the metal housing toward the bottom portion of the plastic case while the flat plate portion is brought into contact to a front surface of the metal housing. Owing to the conductive spring member, an electrical path to the plastic case of the LD/PD integrated module is reliably secured, and the LD/PD integrated module is reliably fixed.

(4) Further, the flat plate portion of the spring member having a conductivity may be bent toward the front surface of the metal housing in a valley manner so as to have a spring property.

(5) Further, the spring member may be provided with a lead plate so as to be connected to a ground terminal or a power supply terminal of the circuit board therethrough. Accordingly, in a case where the metal housing of the LD/PD integrated module have a ground potential, it is reliably grounded to a ground terminal of the circuit board, so the ground potential is stabilized. Further, in a case where the metal housing of the LD/PD integrated module has a power supply potential, the power supply is virtually grounded, so the potential is stabilized.

(6) For a mode that connects the spring member to the circuit board, the lead plate provided to the spring member is made to be a surface mount device type (SMD), with the result that processability can be increased.

(7) Further, in a case where the lead plate provided to the spring member is made to be an insertion mount device type (IMD) and is connected to the ground terminal or a through hole connected to the power supply, connection to a ground layer or a power supply layer in a circuit board layer is increased. Thus, further lower impedance can be attained and the potential can be further stabilized.

(8) The optical transmitting/receiving apparatus has a structure in which: the optical fiber is led out of an end of the LD/PD integrated module; and the plastic case mixed with the conductive filler includes a bottom portion and a side wall portion. With regard to the plastic case, a part of the side wall portion corresponding to a portion led out of the optical fiber may be formed to be an opening in a front direction, and there may be provided a sleeve mixed with the conductive filler protruding from an edge of the opening in a lead-out direction. Accordingly, magnetic crosstalk is suppressed especially in the lead-out portion.

(9) The optical transmitting/receiving apparatus according to the above item (1) has a structure in which the conductive filler is mixed with the plastic case. Alternatively, there may be used an optical transmitting/receiving apparatus in which an LD/PD integrated module is coated with a plastic material whose impedance is controlled by mixing a conductive filler into the plastic case.

According to the present invention, the circuit board is accommodated in the plastic case whose impedance is controlled by mixing the conductive filler into the plastic case, and the LD/PD integrated module is allowed to abut on the plastic case. Accordingly, it is possible to suppress electrical crosstalk and magnetic crosstalk also in a plastic case that is downsized, easily processed, lightweight, and low in cost.

Other objects, features, and advantages of the present invention will be illustrated in the drawings and described in the attached scope of claims, and will be clear with reference to the following description (embodiments).

BRIEF DESCRIPTION OF THE DRAWINGS

FIG. 7 is a table representing results of an experimental example.

FIG. 10 is a table representing a relation between improvement effect of crosstalk and processability of a case in a case of changing the content rate of the conductive filler.

DETAILED DESCRIPTION OF THE PREFERRED EMBODIMENTS

Hereinafter, the present invention will be described in more detail referring to the accompanying drawings. The drawings illustrate a preferred embodiment of the present invention. However, the present invention can be implemented in diverse embodiments, and should not be interpreted to be limited to the embodiment described in this specification. Actually, the embodiment is provided in order to thoroughly and completely disclose this specification and to sufficiently represent the scope of the present invention to a person skilled in the art.

(Structure of Optical Transmitting/Receiving Apparatus)

Figure 1:
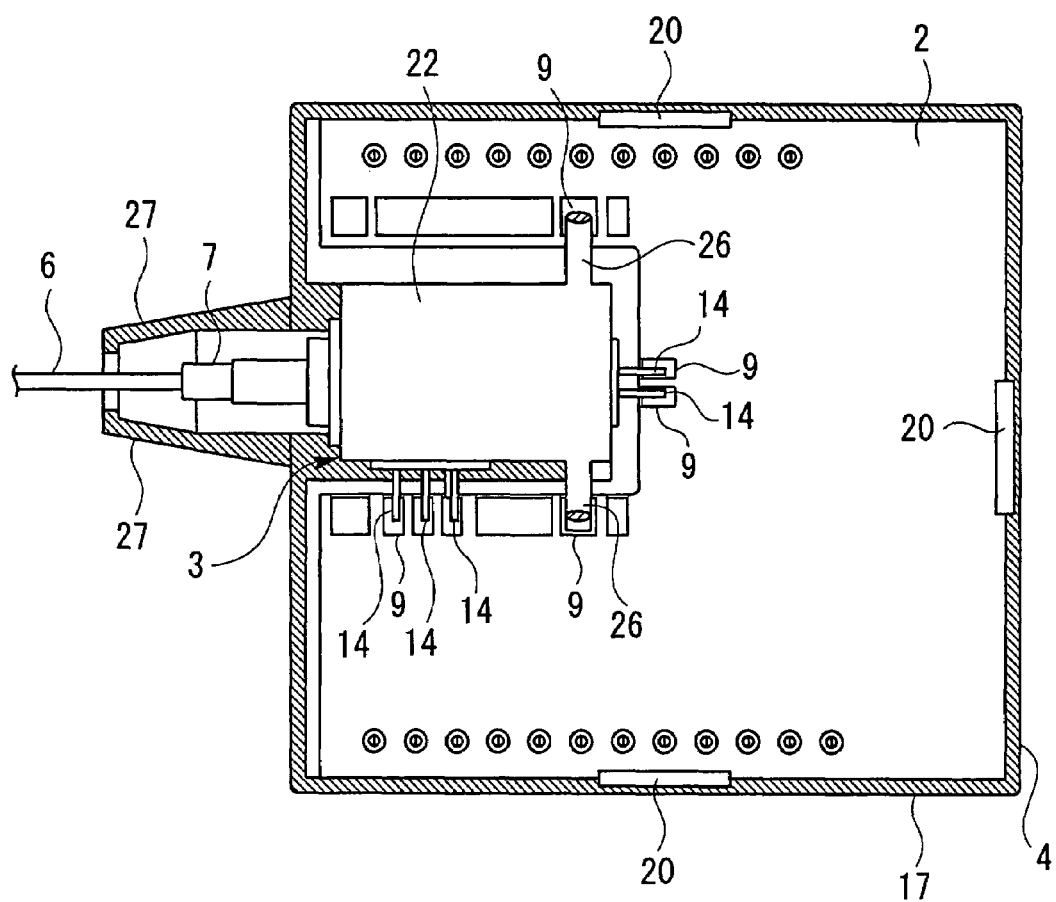
FIG. 1 is a plan view showing an optical transmitting/receiving apparatus according to an embodiment of the present invention.

Referring to FIG. 1 showing an embodiment of the present invention, an optical transmitting/receiving apparatus 1 has a structure in which a circuit board 2 is mounted with a laser diode/photo diode (LD/PD) integrated module 3, and the circuit board 2 is accommodated in a plastic case 4 having an open upper surface, a side wall portion, and a bottom portion.

(Structure of LD/Pd Integrated Module)

Figure 6:
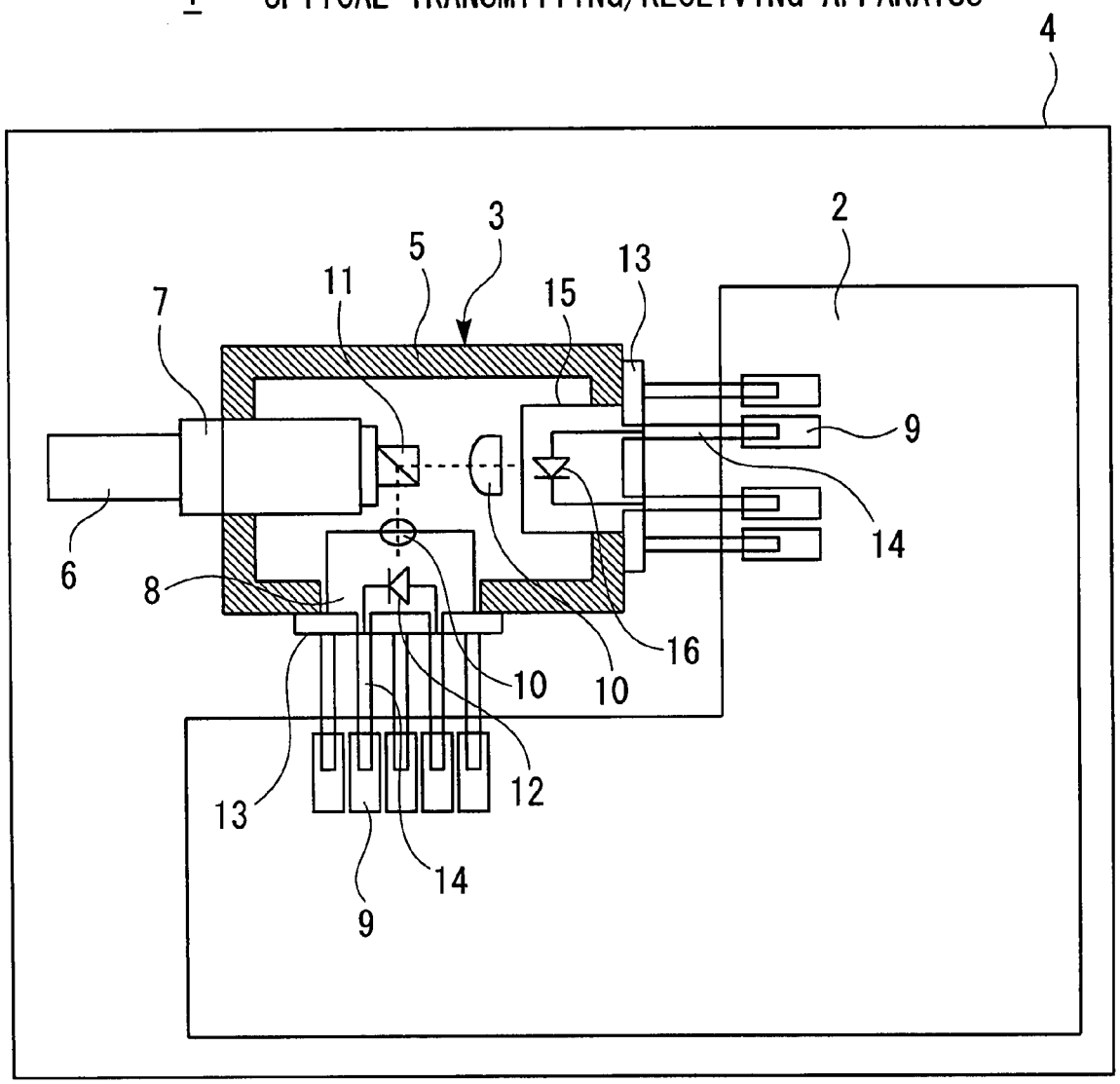
FIG. 6 is an explanatory view showing an inner structure of the LD/PD integrated module.

As shown in FIG. 6, the LD/PD integrated module 3 includes a metal housing 5, and a ferrule 7 made of a ceramic or the like and mounted to an end portion of a single-core bidirectional optical fiber 6 is inserted to one end surface of the metal housing 5 in a longitudinal direction thereof. A wavelength division multiplexing filter (WDM filter) 11 being a prism-shaped wavelength multiplexing and demultiplexing coupler is provided to a portion in the metal housing 5 opposing the ferrule 7, reflects, with respect to a direction orthogonal to an optical axis of the optical fiber 6, received wavelength (e.g., incident light $\lambda=1.55$ μm) from the optical fiber 6 by 90°, and allows a photo diode module (PD module) 8 to receive the light.

The PD module 8 has a CAN package structure, and a photo diode (PD) component 12 inside the PD module 8 receives a reception light from the WDM filter 11 whose focal length is controlled by a lens 10. The PD component 12 is mounted to a component mounting board 13 of the CAN package alone or in a state where the PD component 12 is in combination with an equivalent amplification circuit (TIA: trans-impedance amplifier). Lead pins 14 for power supply, ground (GND), and output of electrical signal are led out of the component mounting board 13, tips of the lead pins 14 are soldered to lands 9 of the circuit board 2, respectively, and optoelectrically converted electrical signal is output to the circuit board 2.

Meanwhile, a laser diode module (LD module) 15 is disposed to the optical axis of the WDM filter 11 opposite to the ferrule. Lead pins 14 for power supply, GND, and the electrical signal are led out of the LD module 15, tips of the lead pins 14 are soldered to lands 9 of the circuit board 2, respectively, the circuit board 2 modulates current of the LD component 16 to perform electrooptical conversion, and the emission light (e.g., λ=1.3 μm) is emitted from the ferrule 7 to the optical fiber 6 through a lens 10 and the WDM filter 11.

Further, the metal housing 5 is electrically connected to GND components of the lead pins 14 of the CAN package of the PD module 8 and the CAN package of the LD module 15.

(Structure of Plastic Case)

The plastic case 4 is formed of a polymer-based synthetic resin, for example, and a conductive filler made of carbon is mixed therewith. The plastic case 4 mixed with the conductive filler needs to have impedance of several Ω to several hundreds of Ω in order to exhibit dumping effect with respect to resonance frequency that the LD/PD integrated module 3 itself has, and a material flowability and a case strength of the plastic case 4 need to be considered with regard to fillability to a case mold and processability, respectively.

Figure 9:
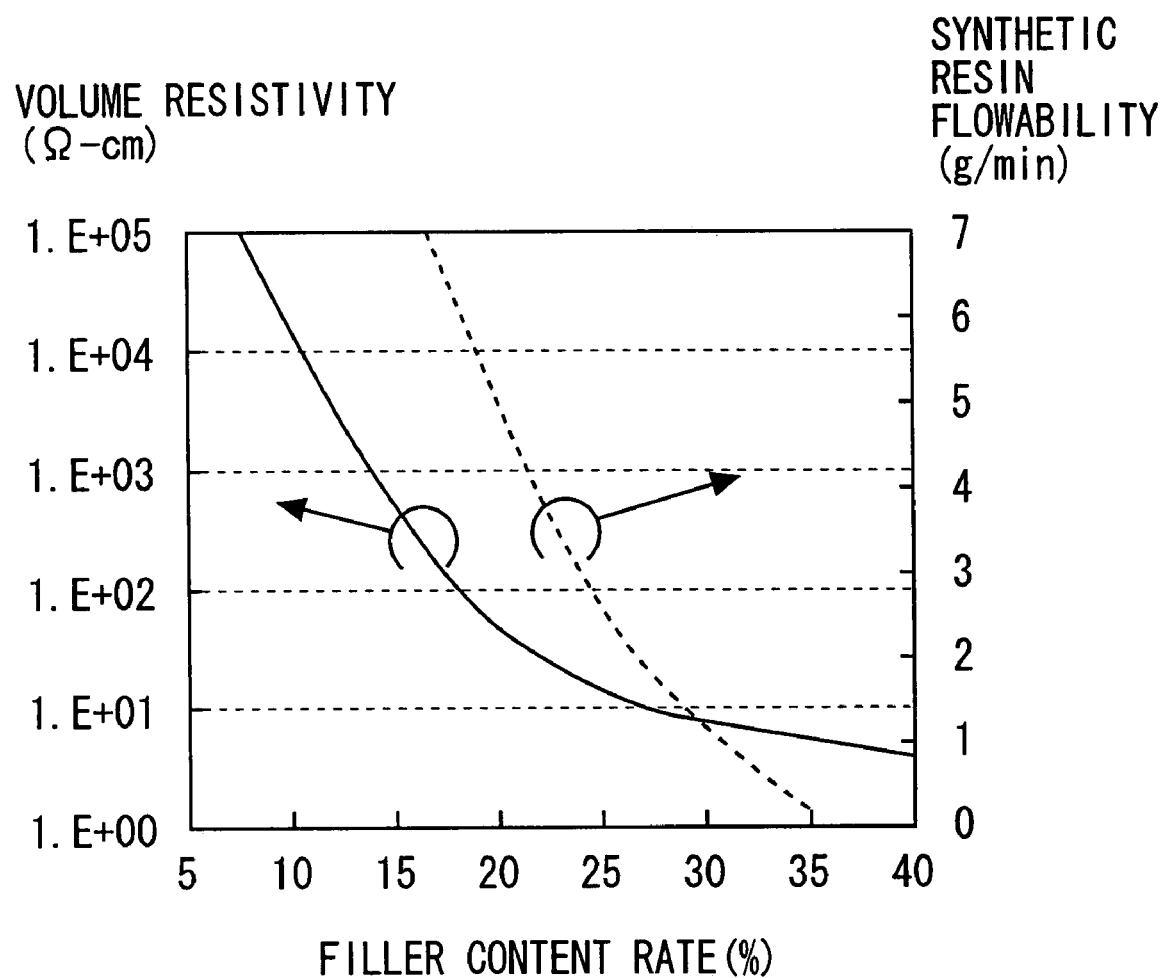
FIG. 9 is a graph showing relations between a content rate of a conductive filler, a volume resistivity thereof, and flowability of a synthetic resin.

FIG. 9 shows a relation between a content rate of the conductive filler and a volume resistivity represented in a first axis, and a relation between the content rate of the conductive filler and flowability of the synthetic resin when mold-processed under a constant pressure and a constant temperature represented in a second axis. In order to impart impedance of several Ω to several hundreds of Ω, in the case of the conductive filler made of carbon, it is preferable to add the conductive filler by approximately 20% to 30%. Further, regarding fillability to a case mold and processability, the material flowability generally falls within a range of 1.3 g/min to 6 g/min. Note that the addition amount changes depending on a processing condition or properties or a length of fiber of the conductive filler to be used, and is not limited to the above.

FIG. 10 represents a relation between improvement effect of crosstalk and processability of the case in a case of changing the content rate of the conductive filler. As the addition amount of the conductive filler increases, the impedance of the plastic case 4 lowers, but viscosity of the material reduces, with the result that processability during molding deteriorates. On the other hand, as the conductive filler is added less in amount, the viscosity of the material increases, with the result that processability during molding is enhanced, but strength for a case cannot be secured, and the impedance of several Ω to several hundreds of Ω in order to exhibit the dumping effect cannot be imparted.

Further, a glass filler or the like may be further mixed with the plastic case 4 in order to secure the strength for a case in addition to the conductive filler.

Figure 3:
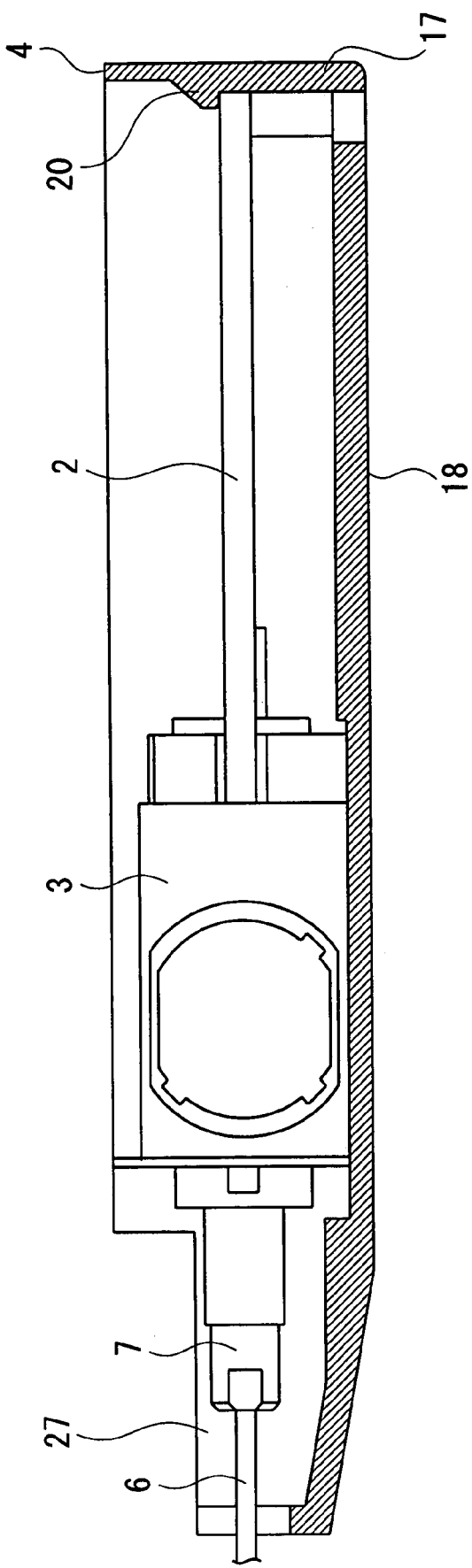
FIG. 3 is a cross-sectional view showing the optical transmitting/receiving apparatus viewed from a side direction.

As shown in FIGS. 1 and 3, the plastic case 4 includes a side wall portion 17 provided over four side surfaces and a bottom portion 18 so as to form a accommodating space that is used for accommodating the circuit board 2. On an inner space side of the side wall portion 17, three claw portions 20 are provided, each of which is formed to be thick downward. The circuit board 2 is pushed downward from the upper surface of the case to the bottom portion 18 thereof, so the circuit board 2 is prevented from falling off and can be fixed thereto.

Figure 4:
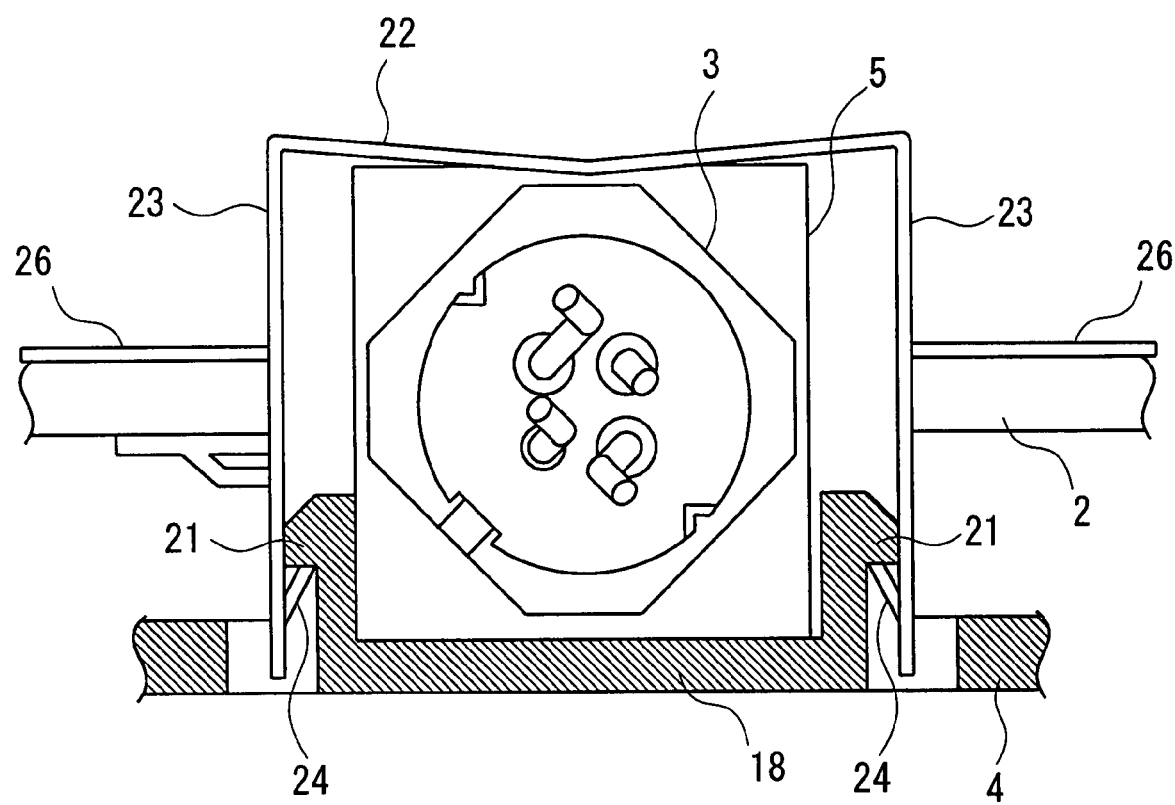
FIG. 4 is a partially cross-sectional lateral view showing a mounting structure of an LD/PD integrated module.

On the bottom portion 18 of the plastic case 4 corresponding to the LD/PD integrated module 3, a pair of projection claws 21 is formed as shown in FIG. 4, and the LD/PD integrated module 3 is positioned between the pair of projection claws 21. An engagement claw 24 provided to a leg portion 23 of a spring member 22 is engaged with each of the pair of projection claws 21.

(Structure of Spring Member)

Figure 5:
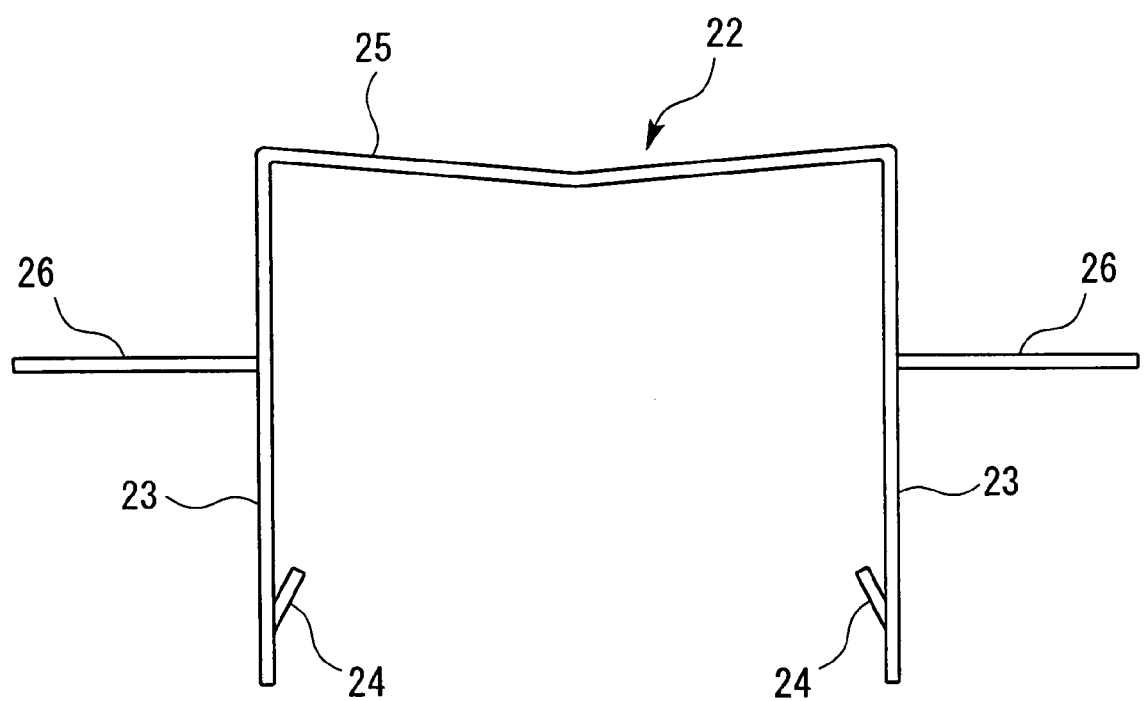
FIG. 5 is a lateral view showing the spring member.

As shown in FIG. 5, the spring member 22 is processed to have a square C-shaped section having a lower portion open. In the vicinity of a tip end of each of the pair of leg portions 23 vertically bent from a spring main body 25 having a flat plate shape, the inwardly-protruding engagement claw 24 is provided. Further, in the vicinity of back end of the spring main body 25, wing-shaped lead plates (surface mount device type: SMD) 26 horizontally protrude in two opposing directions.

The spring main body 25 is bent in a valley manner by a small angle (3 to 10° in horizontal direction) in a longitudinal direction of the center thereof.

Figure 2:
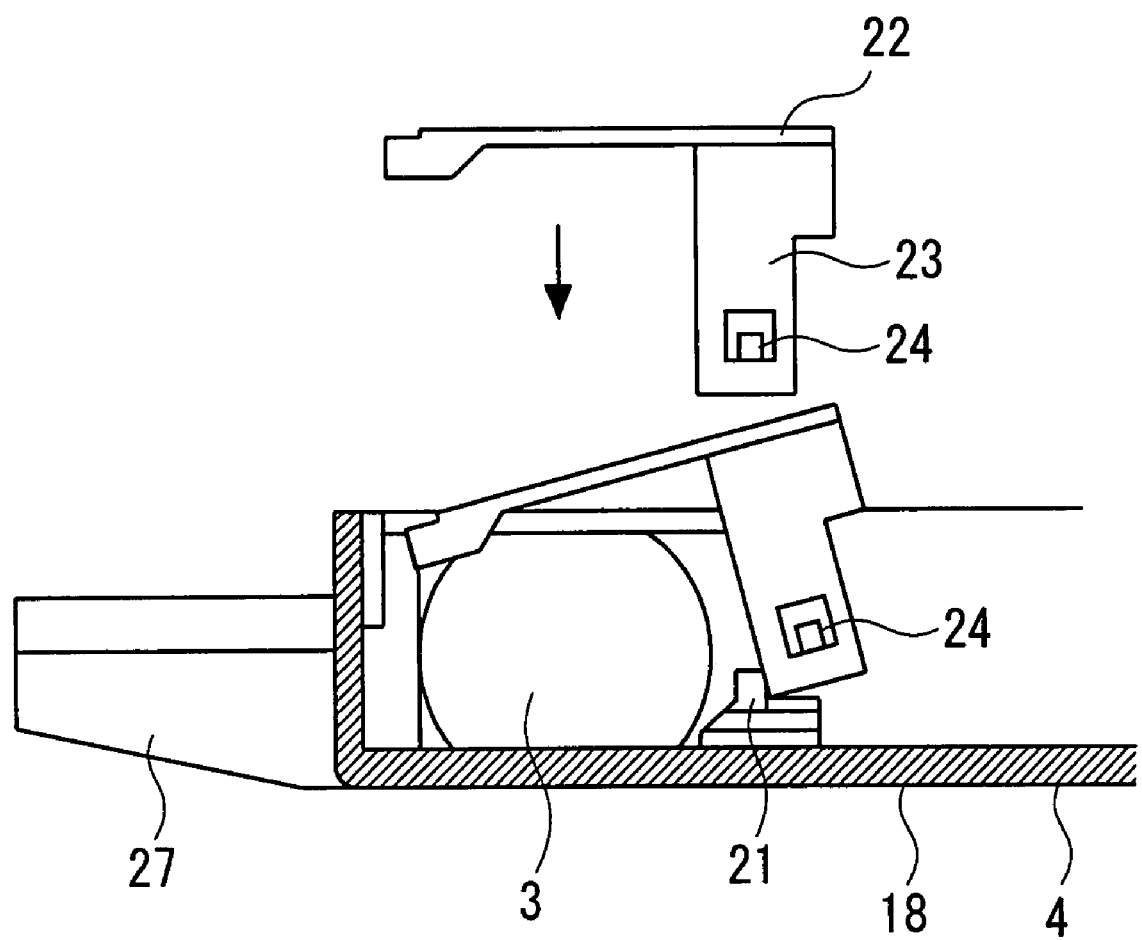
FIG. 2 is a partially cross-sectional front view showing a procedure of attaching a spring member.

In a case of mounting the spring member 22 to the plastic case 4, as shown in FIG. 2, the spring member 22 is pressed toward the bottom portion 18 from the above such that the engagement claws 24 of the leg portions 23 of the spring member 22 are engaged with the protrusion claws 21 of the plastic case 4, and then the tip ends of the lead plates 26 are soldered to the lands (ground terminals) 9 of the circuit board 2. In this case, owing to the above-mentioned small-angle processing of the spring main body 25 in a valley manner, the LD/PD integrated module 3 is reliably fixed to the bottom surface (bottom portion 18) of the plastic case 4, and the metal housing 5 of the LD/PD integrated module 3 electrically is brought into contact to the plastic case 4 in a reliable manner.

In addition, owing to the small-angle processing of the spring main body 25 in a valley manner, the electric contact state of the LD/PD integrated module 3 and the spring member 22 can be maintained reliably, and the LD/PD integrated module 3 is reliably connected to the ground terminal of the circuit board 2 through the lead plates 26 each being a plate spring. Thus, the ground of the LD/PD integrated module 3 is approximately ideal, and an inductance component of the LD/PD integrated module 3 can be reduced.

(Electrical Crosstalk Suppression Mechanism)

Figure 11:
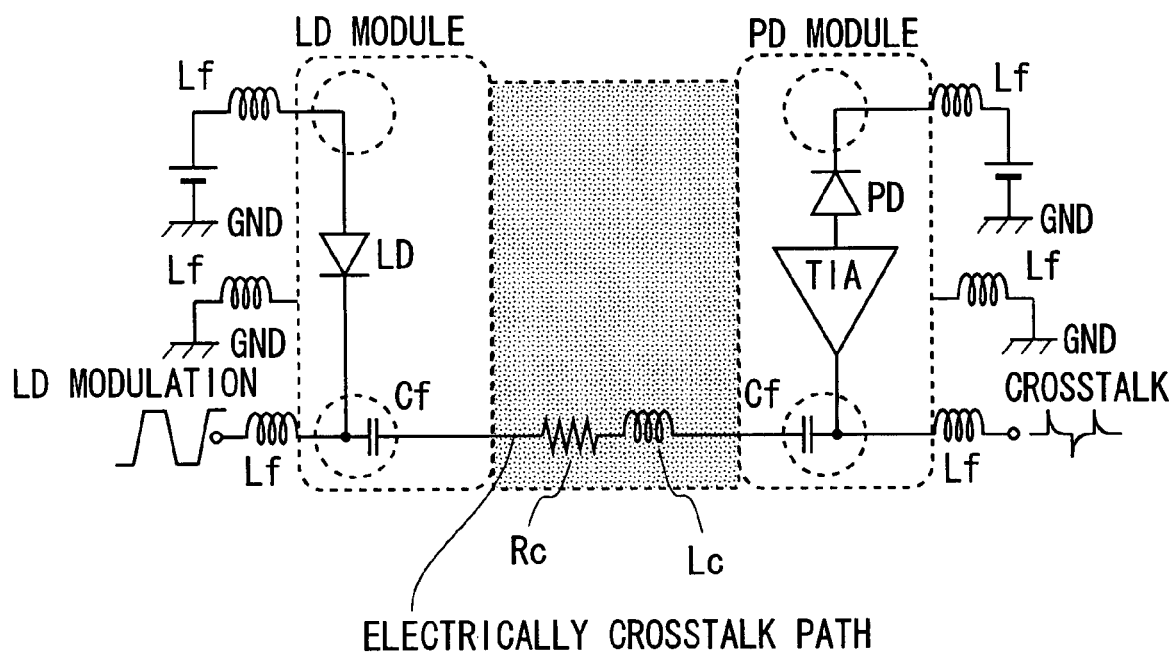
FIG. 11 is a diagram showing a generation mechanism of electrical crosstalk.
Figure 12:
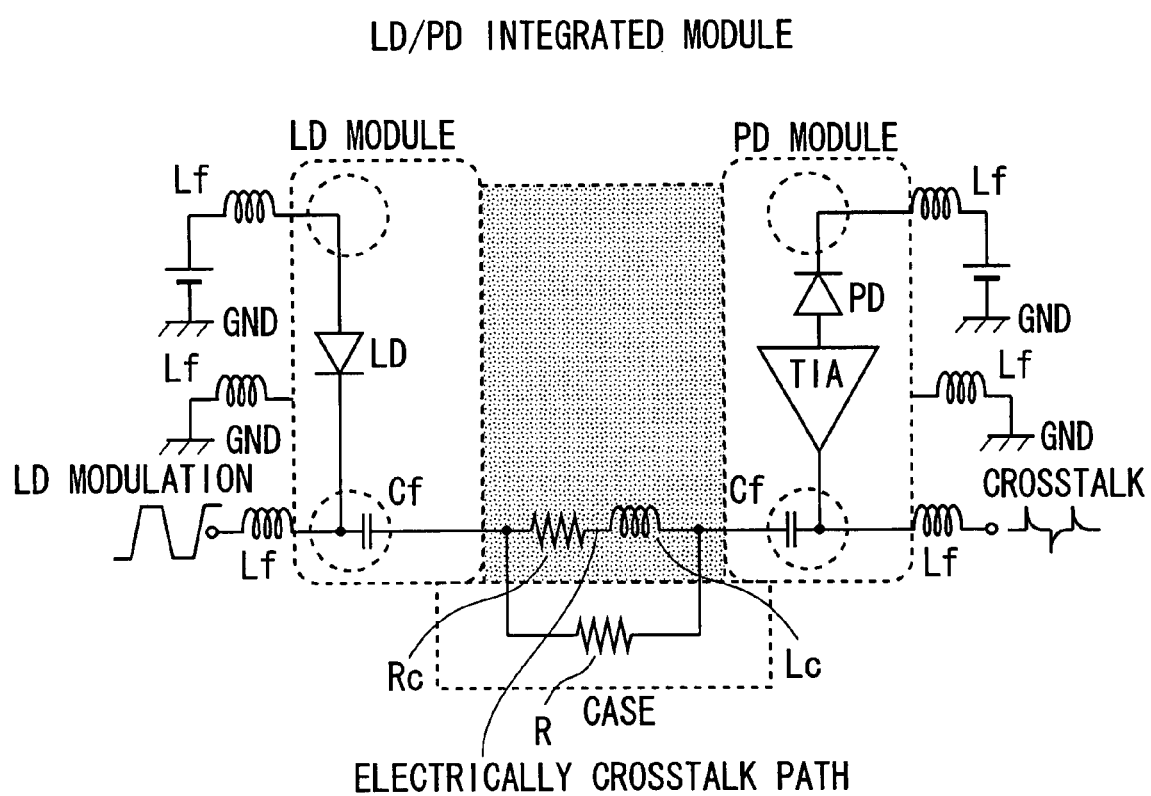
FIG. 12 is a diagram showing a suppression mechanism of electrical crosstalk.

FIG. 12 shows a suppression mechanism of electrical crosstalk. As described above referring to FIG. 11, in the case of driving the LD module at high frequency (LD modulation), owing to parasitic effects of stray capacitance (Cf) of the lead pins and the inner structural components of the optical devices of the LD and the PD, stray inductance (Lf) of the metal housing portion, and the like, the ground (GND) of the LD/PD integrated module does not become ideal.

As a result, an electrical crosstalk path is formed between a transmission side (light emitting side) and a reception side (light receiving side) of the integrated module, and a magnetic noise (magnetic crosstalk) generates, with the result that reception sensibility deteriorates.

However, the plastic case obtained by mixing the conductive filler to the plastic case 4 to control impedance is allowed to abut on the LD/PD integrated module, so an inductance component (Lc) forming the electrical crosstalk path is connected to a resistant component (R) in parallel. As a result, the dumping effect is imparted to resonance frequency of the inductance component, and the electrical crosstalk and the magnetic crosstalk can be suppressed.

The plastic case 4 mixed with the conductive filler needs to have impedance of approximately several Ω to several hundreds of Ω in order to exhibit the dumping effect with respect to the resonance frequency that the LD/PD integrated module itself has.

EXPLANATION ON EXAMPLE

FIG. 7 shows results of deterioration amounts of crosstalk measured by the inventors of the present invention in a case where conditions regarding the combination of the plastic case 4, the spring member 22, and a sleeve 27 are changed. In the figure, there are shown measurement results of a deterioration amount owing to the crosstalk between a case where transmission is not performed by the LD component 16 (untransmitted) and a case where transmission is performed (transmitted), while a reception state by the PD component 12 is maintained.

As apparent from the figure, the plastic cases 4 mixed with the conductive fillers (experimental example numbers 4 to 6) have deterioration amounts less than those of plastic cases with no conductive filler mixed (experimental example numbers 1 to 3), and exhibit preferable results.

Further, in the case where the metal spring member 22 is mounted and connected to the bottom portion 18 of the plastic case 4 and the ground terminal of the circuit board 2, the deterioration amount is reduced (experimental example numbers 3, 5, and 6). In addition, comparing the experimental example number 5 and the experimental example number 6, one provided with the sleeve 27 can suppress the magnetic crosstalk in a large amount.

EFFECT OF EMBODIMENT

With regard to the optical transmitting/receiving apparatus 1 according to the embodiment of the present invention, first, it is possible for the LD/PD integrated module 3 to reliably contact the plastic case 4 mixed with the conductive filler, and second, it is possible for the metal housing 5 of the LD/PD integrated module 3 to be reliably grounded to the ground terminal of the circuit board 2. Thus, owing to the synergy effect of the first and second effects, the electrical crosstalk and magnetic crosstalk can be suppressed.

In addition, with regard to the side wall portion 17 of the plastic case 4, the side on which the optical fiber 6 is led out of the ferrule 7 includes an opening portion. The opening portion is provided with the sleeve 27 for covering the ferrule 7. The sleeve 27 is integrally structured with the plastic case 4, so the conductive filler is mixed with the sleeve 27. Thus, owing to the sleeve 27 mixed with the conductive filler, magnetic crosstalk in the vicinity of the ferrule 7 can be suppressed.

MODIFIED EXAMPLE

Figure 8:
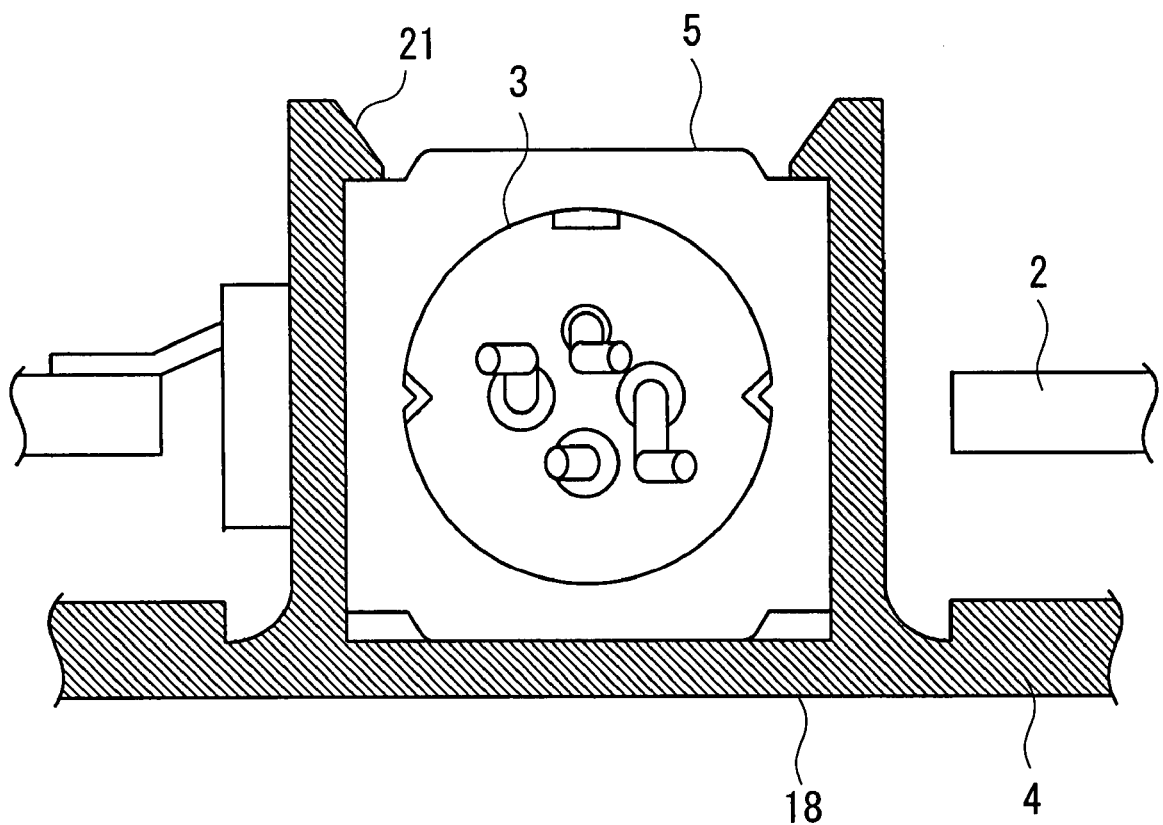
FIG. 8 is a partially cross-sectional lateral view showing another mounting structure of the LD/PD integrated module.

In the above-mentioned embodiment, the description has been made on the LD/PD integrated module 3 by way of the structural example in which the tip ends of the leg portions 23 of the spring member 22 are engaged with the protrusion claws 21 of the bottom portion 18 of the plastic case 4. However as described above, a structure employing no spring member 22 can also suppress electrical crosstalk and magnetic crosstalk as long as the metal housing 5 of the LD/PD integrated module 3 is disposed so as to contact the plastic case 4. In the case of employing no spring member 22 as described above, as shown in FIG. 8, the pair of protrusion claws 21 may be caused to protrude upward to approximately a height of the side wall portion 17 from the bottom portion 18 of the plastic case 4 to thereby directly fix the metal housing 5 by the projection claw 21.

Further, the description has been made on the optical transmitting/receiving apparatus 1 by way of a so-called pick-tail type structure in which the optical fiber 6 is directly led out of the LD/PD integrated module 3 through the ferrule 7. Alternatively, a so-called resectable structure may be employed in which the optical fiber 6 can be dismounted.

The structure of the optical transmitting/receiving apparatus 1 according to the embodiment of the present invention can be modified and structured as follows.

(1) An optical transmitting/receiving apparatus including: a light emitting device/light receiving device integrated module being coated with a synthetic resin material whose impedance is controlled by mixing a conductive filler, that terminates a single-core bidirectional optical fiber; a circuit board electrically connected to a conductive terminal led out of the integrated module; and a synthetic resin case that accommodates the circuit board. In this case, as a coating technique of the synthetic resin material, vapor deposition or coating can be employed.

(2) An optical transmitting/receiving apparatus including: a light emitting device/light receiving device integrated module that terminates a single-core bidirectional optical fiber; a circuit board electrically connected to a conductive terminal led out of the integrated module; and a synthetic resin case that accommodates the circuit board, in which: at least a part of the synthetic resin case is brought into contact with on the integrated module; and impedance of the synthetic resin case is controlled by mixing a conductive filler into the synthetic resin case.

Further, with regard to the optical transmitting/receiving apparatus 1 according to the embodiment described above, as a mode to connect the spring member to the circuit board, the lead plates provided to the spring member is a surface mount device type (SMD). Alternatively, the lead plate provided to the spring member may be an insertion mount device type (IMD).

The present invention can be used to an optical transmitting/receiving technology that terminates an optical fiber.

What is claimed is:

1. An optical apparatus, comprising:
   an integrated module that accommodates a laser diode and a photo diode and terminates an optical fiber;
   a circuit board electrically connected to a lead pin leading out of the integrated module; and
   a case that accommodates the circuit board therein and that is formed of a material that includes a plastic substance;
   wherein at least a part of the case abuts the integrated module;
   impedance of the case is controlled by mixing a conductive filler into the case material; and
   content of the conductive filler in the case material being approximately 20% to 30%.

2. An optical apparatus according to claim 1, wherein the integrated module includes a metal housing.

3. An optical apparatus according to claim 2, further comprising a conductive spring member which is mounted such that a leg portion thereof is engaged with a bottom portion of the case and that a flat plate portion which is continuously provided to the leg portion biases the metal housing toward the bottom portion of the case while the flat plate portion is brought into contact to a front surface of the metal housing.

4. An optical apparatus according to claim 3, wherein the flat plate portion is bent toward the front surface of the metal housing in a valley manner and has a spring property.

5. An optical apparatus according to claim 3, wherein the spring member is provided with a lead plate and connected to a ground terminal or a power supply terminal of the circuit board through the lead plate.

6. An optical apparatus according to claim 5, wherein the lead plate is connected to the ground terminal or the power supply terminal of the circuit board depending on a surface mount device shape.

7. An optical apparatus according to claim 5, wherein the lead plate is connected to the ground terminal or the power supply terminal of the circuit board depending on an insertion mount device shape.

8. An optical apparatus according to claim 1, wherein the optical fiber is led out of an end of the integrated module;
   the case includes a bottom portion and a side wall portion;
   a part of the side wall portion corresponding to a led out portion of the optical fiber is formed to be an opening; and a sleeve protruding from an edge of the opening in a lead-out direction is provided to the case.

9. An optical apparatus, comprising:
an integrated module being coated with a plastic material whose impedance is controlled by mixing a conductive filler, which accommodates a laser diode and a photo diode and terminates an optical fiber;
a circuit board electrically connected to a lead pin that is led out of the integrated module;
a case that accommodates the circuit board and that is formed of a material that includes a plastic substance; and
content of the conductive filler in the case material being approximately 20% to 30%.

10. An optical apparatus, comprising:
an integrated module being coated with a synthetic resin material whose impedance is controlled by mixing a conductive filler, which accommodates a light emitting device and a light receiving device and terminates a single-core bidirectional optical fiber;
a circuit board electrically connected to a conductive terminal that is led out of the integrated module;
a case that accommodates the circuit board and that is formed of a material that includes a synthetic resin; and
content of the conductive filler in the case material being approximately 20% to 30%.

11. An optical apparatus, comprising:
an integrated module that accommodates a light emitting device and a light receiving device and terminates a single-core bidirectional optical fiber;
a circuit board electrically connected to a conductive terminal that is led out of the integrated module; and
a case that accommodates the circuit board and that is formed of a material that includes a synthetic resin;
wherein at least a part of the case is brought into contact with the integrated module;
impedance of the case is controlled by mixing a conductive filler into the material that includes the synthetic resin; and
content of the conductive filler in the material that includes the synthetic resin being approximately 20% to 30%.

12. An optical apparatus according to claim 1, wherein the impedance is controlled owing to a structure in which a resistant component is connected in parallel with an inductance component of an electrical crosstalk path formed between a light emitting side and a light receiving side of the integrated module.

* * * * *